United States Patent
Lin et al.

(10) Patent No.: US 9,698,740 B2
(45) Date of Patent: Jul. 4, 2017

(54) MODE LINEARIZATION SWITCH CIRCUIT

(71) Applicant: Skyworks Solutions, Inc., Woburn, MA (US)

(72) Inventors: Yu-Jui Lin, Westlake Village, CA (US); Andy Cheng Pang Wu, Camarillo, CA (US); Peter Phu Tran, Corona, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 30 days.

(21) Appl. No.: 14/792,427

(22) Filed: Jul. 6, 2015

(65) Prior Publication Data
US 2016/0013767 A1 Jan. 14, 2016

Related U.S. Application Data

(60) Provisional application No. 62/024,307, filed on Jul. 14, 2014.

(51) Int. Cl.
*H03F 1/14* (2006.01)
*H03F 3/217* (2006.01)
*H03F 3/24* (2006.01)
*H03F 1/32* (2006.01)
*H03F 1/02* (2006.01)
*H03F 3/191* (2006.01)
*H03F 3/195* (2006.01)

(52) U.S. Cl.
CPC ........ *H03F 3/2176* (2013.01); *H03F 1/0222* (2013.01); *H03F 1/0261* (2013.01); *H03F 1/32* (2013.01); *H03F 3/191* (2013.01); *H03F 3/195* (2013.01); *H03F 3/245* (2013.01); *H03F 2200/102* (2013.01); *H03F 2200/312* (2013.01); *H03F 2200/372* (2013.01); *H03F 2200/451* (2013.01); *H03F 2200/465* (2013.01)

(58) Field of Classification Search
CPC .......................................... H03F 1/14
USPC .................................... 330/51, 302
See application file for complete search history.

(56) References Cited

U.S. PATENT DOCUMENTS

| 7,756,494 | B2 | 7/2010 | Fujioka et al. |
| 8,598,950 | B2 | 12/2013 | Khesbak |
| 8,884,696 | B2 | 11/2014 | Langer |
| 2006/0132232 | A1 | 6/2006 | Baree et al. |

(Continued)

FOREIGN PATENT DOCUMENTS

JP 2008/035487 A 2/2008

OTHER PUBLICATIONS

Written Opinion of the International Searching Authority for Application No. PCT/US2015/040178, dated Nov. 11, 2015, 7 pages.

(Continued)

*Primary Examiner* — Patricia T Nguyen
(74) *Attorney, Agent, or Firm* — Knobbe, Martens, Olson & Bear, LLP

(57) ABSTRACT

Aspects of this disclosure relate to a mode linearization switch circuit that can adjust an effective impedance provided to an output of an amplifier. In an embodiment, an apparatus includes an amplifier configured to amplify a radio frequency (RF) signal and a mode linearization switch circuit electrically coupled to an output of the amplifier. The mode linearization switch circuit can include a capacitor, a switch in series with the capacitor, and a series LC circuit in parallel with the switch.

20 Claims, 7 Drawing Sheets

(56) References Cited

U.S. PATENT DOCUMENTS

| | | |
|---|---|---|
| 2007/0176677 A1 | 8/2007 | Apel |
| 2007/0188224 A1 | 8/2007 | Dow et al. |
| 2007/0232241 A1* | 10/2007 | Carley .................... H04B 1/44 |
| | | 455/83 |
| 2009/0066439 A1 | 3/2009 | Whelan et al. |
| 2010/0271119 A1 | 10/2010 | Karoui et al. |
| 2012/0146731 A1* | 6/2012 | Khesbak ............... H03F 1/0222 |
| | | 330/295 |
| 2013/0127548 A1* | 5/2013 | Popplewell ........... H03F 1/0227 |
| | | 330/297 |
| 2014/0292414 A1* | 10/2014 | Vice ........................ H03F 3/211 |
| | | 330/295 |
| 2014/0312974 A1* | 10/2014 | Khesbak ............. H03G 3/3042 |
| | | 330/279 |
| 2016/0013758 A1* | 1/2016 | Cao ....................... H03F 1/0222 |
| | | 330/297 |

OTHER PUBLICATIONS

PCT International Search Report for Application No. PCT/US2015/040178, dated Nov. 11, 2015, 3 pages.

* cited by examiner

MODE LINEARIZATION SWITCH CIRCUIT

CROSS-REFERENCE TO RELATED APPLICATION

This application claims the benefit of priority under 35 U.S.C. §119(e) of U.S. Provisional Patent Application No. 62/024,307, filed Jul. 14, 2014 and titled "MODE LINEARIZATION SWITCH CIRCUIT," the entire disclosure of which is hereby incorporated by reference in its entirety herein.

BACKGROUND

Technical Field

This disclosure relates to electronic systems and, in particular, to circuits associated with amplifiers.

Description of the Related Technology

A desire for circuits to consume less power has led to amplifiers, such as power amplifiers, being configured to improve power added efficiency (PAE) in certain applications. For instance, increased PAE in a mobile device can lead to increased battery life. However, improving PAE can come at the expense of other performance parameters, such as linearity. Linearity can be a significant performance parameter, for example, in a power amplifier system that is configured to transmit signals in a plurality of different frequency bands. Engineering tradeoffs between achieving a relatively high PAE and relatively high linearity have been difficult to balance in certain applications.

SUMMARY OF CERTAIN INVENTIVE ASPECTS

The innovations described in the claims each have several aspects, no single one of which is solely responsible for its desirable attributes. Without limiting the scope of the claims, some prominent features will now be briefly described.

One aspect of this disclosure is an apparatus that includes an amplifier configured to amplify a radio frequency (RF) signal and a mode linearization switch circuit electrically coupled to an output of the amplifier. The mode linearization switch circuit includes a capacitor, a switch in series with the capacitor, and a series LC circuit in parallel with the switch.

The switch can receive a control signal such that the control signal biases the switch on in an enveloping tracking mode and the control signal biases the switch off in an average power tracking mode. An effective impedance of the mode linearization switch circuit can cause linearity of the amplifier to be improved when the switch is biased off. An effective impedance of the mode linearization switch circuit can be configured for class E operation when the switch is biased on.

The mode linearization switch circuit can further include a second capacitor in series with the switch. The switch can be electrically coupled between the capacitor and the second capacitor. The switch can include a field effect transistor. The mode linearization switch circuit can receive a bias voltage at a node between the capacitor and the series LC circuit, in which the bias voltage is at a lower voltage level when the switch is biased on than when the switch is biased off.

The amplifier can include a power amplifier. The power amplifier and the mode linearization switch circuit can be included on the same die. The apparatus can be a power amplifier module that includes a power amplifier die and an other die, in which the power amplifier die includes the power amplifier. Alternatively, the apparatus can be a mobile device that includes an antenna in communication with the power amplifier.

The apparatus can further include an additional mode linearization switch circuit in parallel with the mode linearization switch circuit, in which the additional mode linearization switch circuit and the mode linearization switch circuit have respective effective impedances configured to match different frequency bands.

Another aspect of this disclosure is an electronically implemented method that includes amplifying a radio frequency (RF) signal with a power amplifier in an envelope tracking mode. The method also includes turning off a switch in a mode linearization switch circuit that is electrically coupled to an output of the power amplifier, in which the mode linearization switch circuit includes the switch, a capacitor in series with the switch, and an inductor coupled in parallel with the switch. The method further includes, while the switch is off, amplifying the RF signal with the power amplifier in an average power tracking mode.

The switch can include a field effect transistor and turning off the switch can include adjusting a state of a mode control signal provided to a gate of the field effect transistor. The method can further include providing a bias voltage at a node between the switch and the capacitor, in which the bias voltage is at a lower voltage level in envelope tracking mode than in the average power tracking mode. A series LC circuit that includes the inductor can be coupled in parallel with the switch.

Another aspect of this disclosure is an apparatus that includes a power amplifier configured to amplify a radio frequency (RF) signal and a mode linearization switch circuit. The mode linearization switch circuit includes a capacitor, an impedance circuit, and a switch configurable into at least a first state and a second state. The mode linearization switch circuit is configured to provide an impedance of the capacitor in series with an impedance of the impedance circuit to an output of the power amplifier when the switch is in the first state. The mode linearization switch circuit is configured to prevent the impedance of the impedance circuit from significantly impacting the output of the power amplifier when the switch is in the second state.

The switch can be configured to be in the first state in average power tracking mode and in the second state in an envelope tracking mode. The switch can be in parallel with the impedance circuit. The impedance circuit can be an LC circuit. For instance, the impedance circuit can be a series LC resonant circuit. The mode linearization switch circuit can further include a second capacitor, in which the mode linearization switch circuit is configured to provide the impedance of the capacitor in series with the impedance of the impedance circuit and further in series with an impedance of the second capacitor to the output of the power amplifier when the switch is in the first state.

For purposes of summarizing the disclosure, certain aspects, advantages and novel features of the inventions have been described herein. It is to be understood that not necessarily all such advantages may be achieved in accordance with any particular embodiment of the invention. Thus, the inventions may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 2C is a schematic diagram of an effective impedance of the mode linearization circuit of FIG. 2A when the switch is biased on.

DETAILED DESCRIPTION OF CERTAIN EMBODIMENTS

Figure 1:
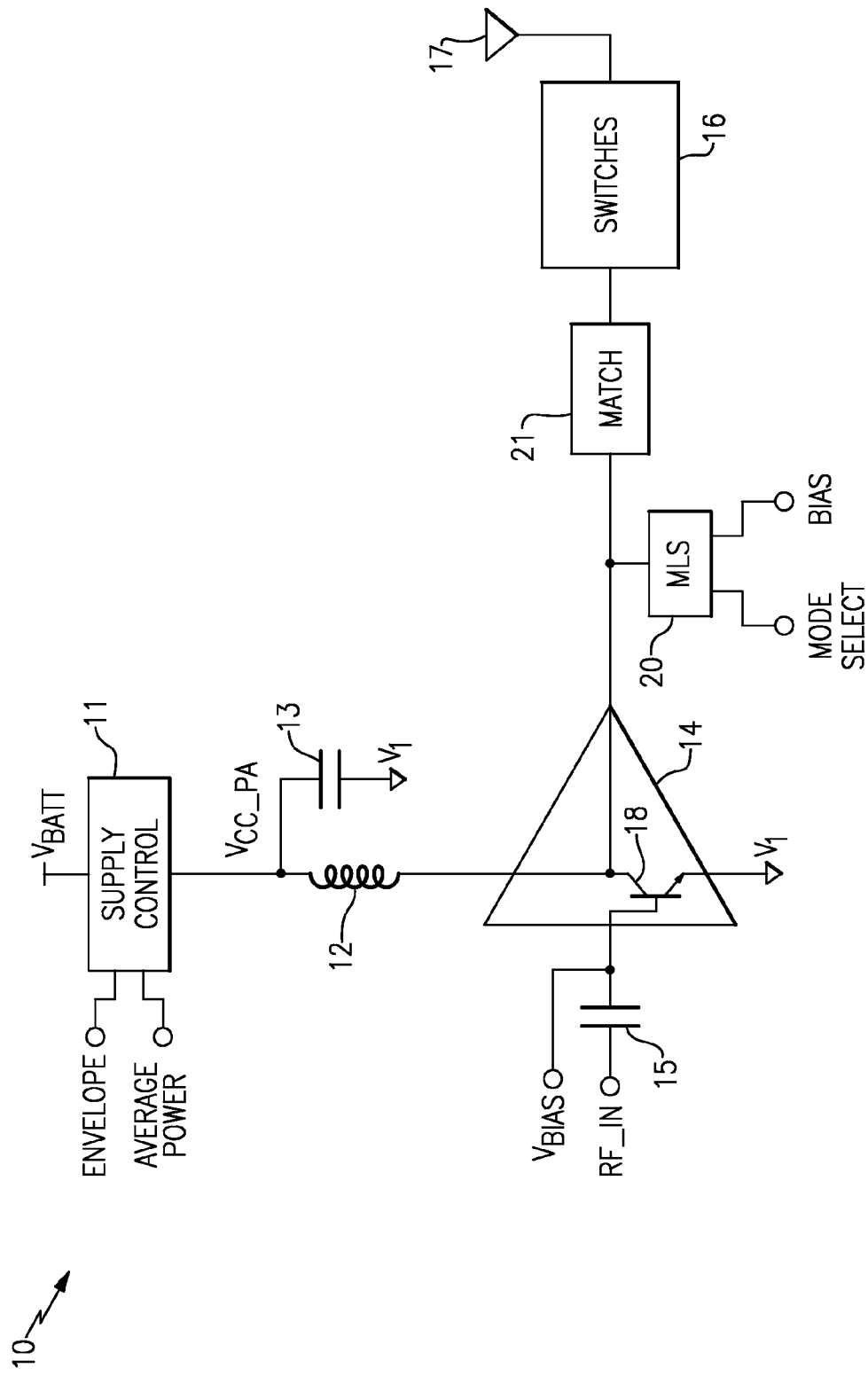
FIG. 1 is a schematic block diagram of a power amplifier system according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that embodiments can include more elements than illustrated in a particular drawing and/or a subset of the illustrated elements in a particular drawing.

Envelope tracking (ET) systems are becoming more prevalent in mobile phone designs. In such applications, some power amplifiers (PAs) are being configured to improve power added efficiency (PAE) at the expense of linearity. Some such systems can implement digital pre-distortion (DPD) to correct for some or all nonlinearities that arise. ET systems can also incur their own distortion depending on de-cresting utilized for an input waveform. To achieve a relatively high PAE, PAs can be configured to operate as class E amplifiers. Class E amplifiers can have linearity characteristics that do not meet certain linearity specifications. Linearity can be a significant characteristic, especially in a PA system that is configured to transmit signals within a plurality of different frequency bands. An adjacent channel power ratio (ACPR) and/or an adjacent channel power (ACP) are example metrics to assess linearity of a power amplifier.

Spurious emission cases that are ACP limited can benefit from the principles and advantages discussed herein. Some of these spurious emissions cases include, but are not limited to, NS_07, NS_08, NS_12, NS_13, NS_14, NS_15, B8 OOBE, BC10 OOBE, and band 13 emissions in the band 14 public safety band. Aspects of this disclosure relate to being able to correct for such linearity deficiencies and to meeting ACP and emissions specifications.

Implementing aspects of this disclosure can reduce dependency on duplexer out of band rejection. For example, a band 13 transmit duplexer rejection in band 14 has been relied on in certain applications to meet various emissions specifications. Additional transmit insertion loss can be incurred as a consequence to the improved band 14 rejection. This can adversely affect linearity and/or current consumption.

Some communications systems, such as mobile phone systems, can operate in average power tracking (APT) mode. Operating in APT mode typically avoids inherent linearity challenges of an ET system. Some ET phone systems have implemented a DPD function based on center channel characteristics and applied them over the band. This can cause the ACP to degrade at the edges of the band since the PA characteristics, especially when driving into a duplexer, can be significantly different at different frequencies. APT systems can get around this problem in certain implementations, since the PA can operate in the linear region and can have margin to the ACP and emissions specifications. This can come at the expense of PAE. Moreover, some older systems also had less stringent specifications that utilized higher max power reduction. As an example, a current NS_07 output power specification is 25 dBm with full Long Term Evolution (LTE) Resource Block (RB) allocation. Previous specifications only required 12 dBm output power with full 50RB allocation and, consequently, would have problems meeting the current NS_07 power specification.

Aspects of this disclosure relate to operating a PA system in both ET and APT modes. A mode linearization switch circuit coupled to a power amplifier output, such as a collector of a power amplifier bipolar transistor, can include a switch, one or more capacitors in series with the switch, and a series LC resonant circuit in parallel with the switch. The switch in combination with the series LC circuit and the one or more capacitors can be referred to as a mode linearization switch circuit. The switch can be, for example, a field effect transistor (FET). The one or more capacitors in series with the switch can function as a class E capacitor in ET mode. The one or more capacitors can include a first capacitor and a second capacitor, in which the switch is disposed between the first capacitor and the second capacitor. When the PA system operates in ET mode, the switch is biased on and the first capacitor and the second capacitor can be connected to each other in series. This can prevent the LC circuit from significantly contributing to an effective impedance provided to the power amplifier output. The resulting effective impedance of the two series capacitors can have a desired class E capacitance value. When the device operates in APT mode, the switch can be biased off. Biasing the switch off can introduces the series LC resonant circuit in series between the two capacitors. The resulting circuit in APT mode can function as a frequency trap, which can be tuned for desired (e.g., optimal) linearity performance and reduced emissions. Simulation data indicate that class E operation for the ET mode is not significantly impacted by the mode linearization switch circuit.

The systems, apparatus, and methods discussed herein can realize one or more of the following advantages, among others. The mode linearization switch circuits described herein can enable a power amplifier system to operate at a relatively higher power and still meet emission specifications. By improving the ACP, a duplexer having less out of band rejection can be implemented while still meeting emissions specifications. This can, for example, reduce transmit current consumption. Accordingly, overall system current can be reduced. The mode linearization switch circuits described herein can switch between a high efficiency class E output match to a more linear output match without incurring relatively high insertion losses. Moreover, in certain implementations, the switch in the mode linearization switch circuit and/or other components in the mode linearization switch circuit can be implemented on a power amplifier die without significantly increasing the power amplifier die area.

Referring to FIG. 1, a schematic block diagram of an example of a power amplifier system 10 including a mode linearization switch circuit 20 will be described. The illustrated power amplifier system 10 includes a supply control 11, an inductor 12, a decoupling capacitor 13, a power amplifier 14, an input capacitor 15, the mode linearization switch circuit 20, a matching network 21, a switch module 16, and an antenna 17. Embodiments of the power amplifier system 10 can include more or fewer elements than illustrated.

The illustrated supply control 11 is configured to receive an envelope signal and an average power signal and to generate a power amplifier supply voltage $V_{CC\_PA}$ for the power amplifier 14 using a battery voltage $V_{BATT}$. The envelope signal can represent an envelope of a radio frequency signal received by the power amplifier 14. A radio frequency (RF) signal can have a frequency in the range from about 30 kHz to 300 GHz. The average power signal can represent an average power of the RF signal received by the power amplifier 14. When operating in an ET mode, the power amplifier supply voltage $V_{CC\_PA}$ can be based on the envelope signal. When operating in an APT mode, the power amplifier supply voltage $V_{CC\_PA}$ can be based on the average power signal. The supply control 11 can operate in either the ET mode or the APT mode responsive to a mode control signal MODE SELECT. For instance, the mode control signal MODE SELECT can be a binary signal and the supply control can operate in the ET mode in one state of the mode control signal and operate in the APT mode in the other state of the mode control signal.

The inductor 12 can be included to power the power amplifier 14 with the power amplifier supply voltage $V_{CC\_PA}$ generated by the supply control 11 while choking or blocking high frequency RF signal components. The inductor 12 can include a first end electrically connected to the supply control 11, and a second end electrically connected to the collector of the bipolar transistor 18. As illustrated, the decoupling capacitor 13 is electrically connected between the power amplifier supply voltage $V_{CC\_PA}$ and the power low voltage $V_1$. The power low voltage $V_1$ can be at a ground potential. The decoupling capacitor 13 can provide a low impedance path to high frequency signals, thereby reducing the noise of the power high voltage $V_{CC}$, improving power amplifier stability, and/or improving the performance of the inductor 12 as an RF choke. In some implementations, a capacitor in parallel with the inductor 12 can be implemented in place of the decoupling capacitor 13.

The illustrated power amplifier 14 includes a bipolar power amplifier transistor 18 having an emitter, a base, and a collector. The bipolar power amplifier transistor 18 can be a GaAs transistor. The bipolar power amplifier transistor 18 can be a single heterojunction transistor. The emitter of the bipolar power amplifier transistor 18 can be electrically connected to a power low supply voltage $V_1$, which can be, for example, a ground supply. Additionally, a radio frequency (RF) signal can be provided to the base of the bipolar power amplifier transistor 18. A radio frequency input signal RF_IN can be provided to the base of the bipolar power amplifier transistor 18 through the input capacitor 15. A bias voltage $V_{BIAS}$ can also be provided to the base of the bipolar power amplifier transistor 18 to bias the bipolar power amplifier transistor 18. The bipolar power amplifier transistor 18 can amplify the RF signal to generate an amplified RF signal at the collector. The bipolar transistor 18 can be any suitable device. In one implementation, the bipolar transistor 18 is a heterojunction bipolar transistor (HBT).

The matching network 21 can be used to terminate the electrical connection between the power amplifier 14 and the switch module 16, which can aid in increasing power transfer and/or reducing reflections of the amplified RF signal generated using the power amplifier 14. The mode linearization switch circuit 20 can provide an impedance to an output of the power amplifier 14. The impedance can be provided between the collector of the bipolar power amplifier transistor 18 and the emitter of the bipolar power amplifier transistor 18, as the mode linearization switch circuit 20 can include impedance elements disposed between the collector and a power low supply voltage $V_1$ (e.g., ground) that is provided to the emitter. The mode linearization switch circuit 20 can provide harmonic termination in certain implementations. The mode linearization switch circuit 20 can provide an effective impedance for a first mode of operation (e.g., an average power tracking mode) in first state and provide an effective impedance for a second mode (e.g., an envelope tracking mode) in a second state. More details regarding embodiments of the mode linearization switch circuit 20 will be provided later, for example, with reference to FIGS. 2A to 2C and FIG. 5.

The power amplifier 14 can be configured to provide the amplified RF signal to the switch module 16 via the matching network 21. The switch module 16 can provide an RF output signal to the antenna 17.

Although the power amplifier system 10 is illustrated as including a single power amplifier, the teachings herein are applicable to power amplifier systems including multiple power amplifiers, including, for example, multi-band and/or multi-mode power amplifier systems. Although FIG. 1 illustrates one implementation of the power amplifier 14, the teachings described herein can be applied to a variety of power amplifier structures, such as multi-stage power amplifiers and/or power amplifiers employing other transistor structures. For example, in some implementations, a field effect transistor (FET), such as a silicon FET, a gallium arsenide (GaAs) high electron mobility transistor (HEMT), or a laterally diffused metal oxide semiconductor (LDMOS) transistor can be implemented in place of the bipolar transistor 18. The power amplifier can be implemented, for example, on a GaAs die, a SiGe die, or a Si die. Additionally, the power amplifier 14 can be adapted to include additional circuitry, such as biasing circuitry.

Figure 2A:
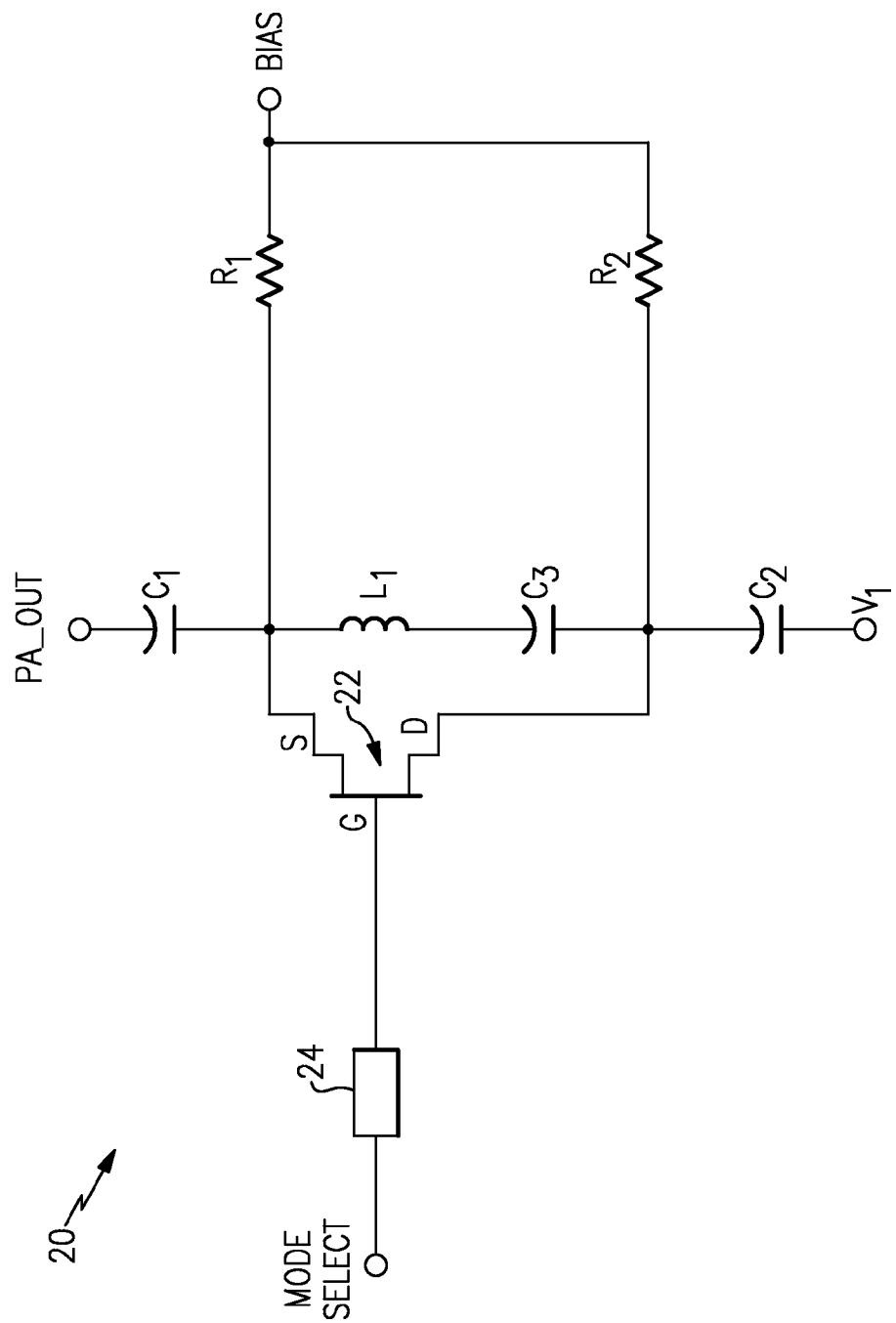
FIG. 2A is a schematic diagram of an example mode linearization switch circuit of FIG. 1 according to an embodiment.

FIG. 2A is a schematic diagram of a mode linearization switch circuit 20 of FIG. 1 according to an embodiment. The mode linearization switch circuit 20 can be electrically coupled to an output PA_OUT of a power amplifier. For instance, the mode linearization switch circuit 20 can be coupled to the collector of the bipolar transistor 18 of the power amplifier 14 of FIG. 1. The illustrated mode linearization switch circuit 20 includes a first capacitor C1, a switch 22, a series LC circuit, a second capacitor C2, a first biasing element R1, a second biasing element R2, and a third biasing element 24. According to certain embodiments, the mode linearization switch circuit 20 can include more or fewer elements than illustrated.

The illustrated mode linearization switch circuit 20 includes a switch 22 in series between the first capacitor C1 and the second capacitor C2. The illustrated switch 22 is also in parallel with the series LC circuit, which includes capacitor C3 and inductor L1. The illustrated series LC circuit is a resonant circuit. While the illustrated mode linearization switch circuit 20 includes a series LC circuit in parallel with the switch 22, any other suitable impedance circuit can be provided in place of or in addition to the series LC circuit to enhance linearity of the power amplifier when the switch 22 is biased off.

The switch 22 can be implemented in any suitable technology. In one implementation, the switch 22 can be a microelectromechanical systems (MEMS) contact switch. According to some embodiments, the switch 22 can be implemented by a field effect transistor (FET) as illustrated in FIG. 2A. For instance, the switch 22 can include at least one of a BiHEMT device, a BiFET device, or a metal oxide semiconductor (MOS) device. When the switch 22 is a FET, the series LC circuit can have a first end electrically coupled to a source of the switch 22 and a second end electrically coupled to a drain of the switch 22. The switch can 22 include a p-type FET and/or an n-type FET.

According to some implementations, the switch 22 can be implemented on the same die as a power amplifier having an output electrically connected to the mode linearization switch circuit 20. Accordingly, a power amplifier die can include the power amplifier 14 and the switch 22. The power amplifier die can also include any or all of the other elements of the mode linearization switch circuit 20. The power amplifier die can be implemented in a power amplifier module. The power amplifier die can include one or more other dies. The power amplifier module can include the matching network 21. In some instances, the power amplifier module can include the switch module 16.

The switch 22 can be suitably sized such that isolation does not significantly degrade when the switch 22 is off and such that a resistance is not too high for a desired application. In one implementation, the switch 22 can be a FET with a gate width of about 2 millimeters (mm) to about 3 mm.

The switch 22 can be configurable into a first state and a second state. A control terminal of the switch 22, such as a gate of a FET, can receive a mode control signal MODE SELECT. The switch 22 can change state (e.g., turn on or turn off) responsive to the mode control signal toggling. The mode control signal MODE SELECT can be an envelope tracking control signal. The mode control signal MODE SELECT can be provided to a supply control, such as the supply control 11 of FIG. 1, and the supply control can operate in either an ET mode or an APT mode responsive to the mode control signal MODE SELECT. An effective impedance of the mode linearization switch circuit 20 when the switch 22 is in the first state and/or the second state can be selected for a particular frequency band.

The switch 22 is configured to be biased off in the first state and to be biased on in the second state. An effective impedance of the mode linearization switch circuit 20 can be configured to improve linearity of an amplifier coupled to the mode linearization switch circuit 20 when the switch 22 is biased off. For instance, the capacitance of the capacitor C3 and the inductance of the inductor L1 can be selected such that linearity of the power amplifier 14 of FIG. 1 is increased and/or optimized for a selected frequency band when the switch 22 is biased off in the first state. In one embodiment, the capacitance of the capacitor C3 and the inductance of the inductor L1 can be selected such that the mode linearization switch circuit 20 provides harmonic termination for a harmonic, such as a second harmonic, or a fundamental frequency of a radio frequency signal the output PA_OUT of the power amplifier when the switch 22 is biased off. An effective impedance of the mode linearization switch circuit 20 can configured for class F operation when the switch 22 is biased off. The first state can correspond to an average power tracking mode. An effective impedance of the mode linearization switch circuit 20 can configured for class E operation when the switch 22 is biased on. The second state can correspond to an envelope tracking mode.

Figure 2B:
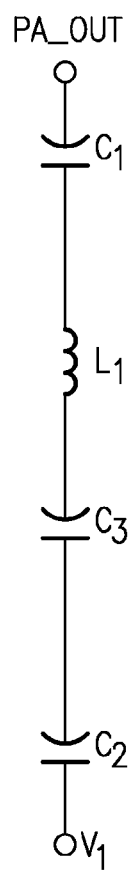
FIG. 2B is a schematic diagram of an effective impedance of mode linearization circuit of FIG. 2A when the switch of the mode linearization switch circuit is biased off.

FIG. 2B is a schematic diagram illustrating an effective impedance of the mode linearization switch circuit 20 of FIG. 2A provided to an amplifier output (e.g., the output of the power amplifier 14 of FIG. 1) when the switch 22 is biased off. As shown in FIG. 2B, the mode linearization switch circuit 20 can provide an impedance of the first and second capacitors C1 and C2, respectively, in series with each other and further in series with the series LC circuit to the output node of the amplifier when the switch 22 is in the first state. The impedance provided by the mode linearization switch circuit 20 when the switch 22 is biased off can provide harmonic termination at a harmonic of a fundamental frequency of the RF signal provided at the amplifier output. The switch 22 of FIG. 2A is configured to introduce the impedance of the series LC circuit between the first capacitor C1 and the second capacitor C2 when the switch 22 is biased off.

Figure 2C:
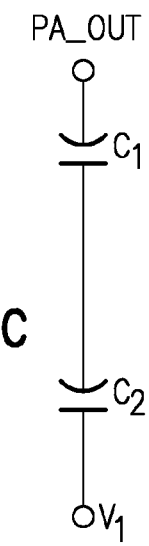

FIG. 2C is a schematic diagram of an effective impedance of the mode linearization switch circuit 20 of FIG. 2A provided to the amplifier output (e.g., the output of the power amplifier 14 of FIG. 1) when the switch 22 is biased on. As shown in FIG. 2C, the mode linearization switch circuit 20 can provide an impedance of the first and second capacitors C1 and C2, respectively, in series to the output of the power amplifier when the switch is in the second state. The switch 22 can connect the first capacitor C1 and the second capacitor C2 in series when the switch 22 is biased on and effectively remove the impedance of the series LC circuit from impacting the output of the power amplifier. When the switch 22 is on, the switch 22 can prevent the impedance of the series LC circuit from significantly impacting the output of the amplifier.

Referring back to FIG. 2A, the illustrated mode linearization switch circuit 20 includes the first biasing element R1 configured to provide a voltage bias signal to a node between the first capacitor C1 and the series LC circuit. For example, the first biasing element R1 can be a resistor having a first end configured to receive a bias signal BIAS and a second end electrically coupled to the node between the first capacitor C1 and the series LC circuit. Such a resistor can have any suitable resistance value, such as on the order of 10s of kilo-Ohms. The bias signal BIAS can be at a high voltage value when the switch 22 is off and the system is operating in average power tracking mode. As an example, the high voltage value can be about 3.6 volts (V) in one implementation. The bias signal BIAS can be at a low voltage value when the switch 22 is on and the system is operating in an envelope tracking mode. As an example, the low voltage value can be about 0.2 V in one implementation. The illustrated mode linearization switch circuit 20 also includes the second biasing element R2. The second biasing element R2 can apply the bias signal BIAS to a node between the second capacitor C2 and the series LC circuit. The second biasing element R2 can be functionally similar to the first biasing element R1 and/or implement any combination of features of the first biasing element R1 in connection with the node between the second capacitor C2 and the series LC circuit.

The illustrated mode linearization switch circuit 20 also includes the third biasing element 24, which can have a relatively high impedance. The third biasing element 24 can apply a mode control signal MODE SELECT to a control terminal of the switch 22. The mode control signal MODE SELECT can have a voltage value configured to bias the switch 22 on in envelope tracking mode and to bias the switch 22 off in average power tracking mode. For instance, in one implementation, the mode control signal MODE SELECT can have a voltage of about 3.2 V to turn the switch 22 on in envelope tracking mode and a voltage of about 0.2 V to turn the switch 22 off on average power tracking mode. The voltage to turn the switch 22 on can be less than the high voltage value for the bias signal BIAS in certain implementations.

Figure 2D:
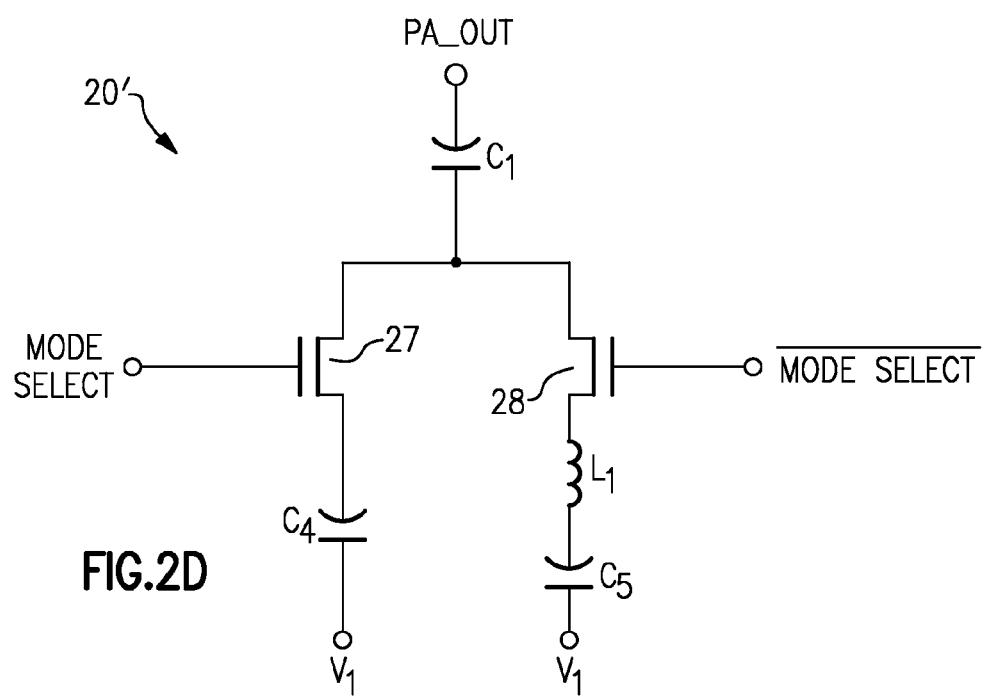
FIG. 2D is a schematic diagram of an example mode linearization switch circuit according to an embodiment.

FIG. 2D is a schematic diagram of another embodiment of a mode linearization switch circuit. This mode linearization switch circuit can be implemented in the power amplifier system of FIG. 1 and/or the power amplifier system of FIG. 5, for example. The illustrated mode linearization switch circuit 20' includes a first switch 27, a second switch 28, capacitors $C_1$, $C_4$, and $C_5$, and inductor $L_1$. The first switch 27 and the second switch 28 can receive control signals that are logical complements of each other (e.g., MODE SELECT and $\overline{\text{MODESELECT}}$. The mode linearization switch circuit 20' can provide an impedance of the capacitors $C_1$ and $C_4$ in series with each other to an output PA_OUT of a power amplifier when the first switch 27 is on and the second switch 28 is off. The first switch 27 can be biased on in an envelope tracking mode. The mode linearization switch circuit 20' can provide an impedance of the capacitor $C_1$ in series the inductor $L_1$ and the capacitor $C_5$ to the output PA_OUT of the power amplifier when the first switch 27 is off and the second switch 28 is on. The second switch 28 can be biased on in an average power tracking mode. In FIG. 2D, the mode linearization switch circuit 20' is configured to provide an impedance of the capacitor $C_1$ in series with a series LC circuit that includes the inductor $L_1$ and the capacitor $C_5$ to the output PA_OUT of the power amplifier when the second switch 28 is on and to prevent the impedance of the series LC circuit from significantly impacting the output PA_OUT of the power amplifier when the second switch 28 is off. The capacitor $C_4$ can have a capacitance that corresponds to the capacitance of the capacitor $C_2$ of FIG. 2A. The capacitor $C_5$ can have a capacitance that corresponds to the capacitance of capacitors $C_2$ and $C_3$ of FIG. 2A in series with each other.

Figure 3A:
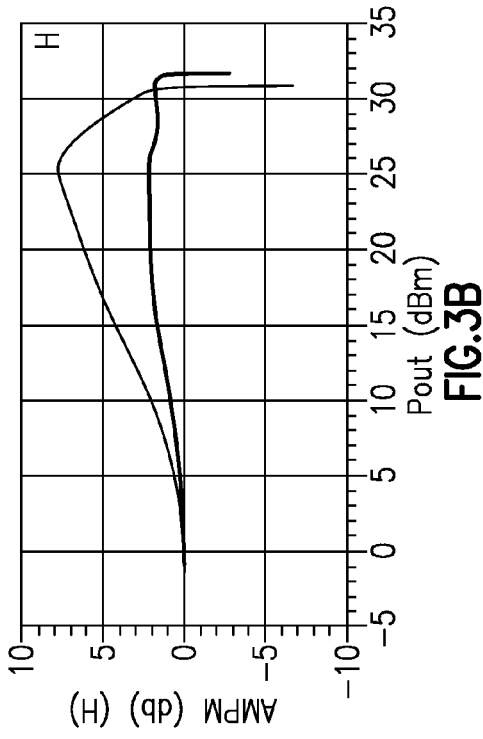
FIGS. 3A to 3D are graphs that compare power amplifier performance in a power amplifier system with the mode linearization switch circuit of FIG. 2A with a corresponding power amplifier system with a class E capacitance connected to a power amplifier output.
Figure 3B:
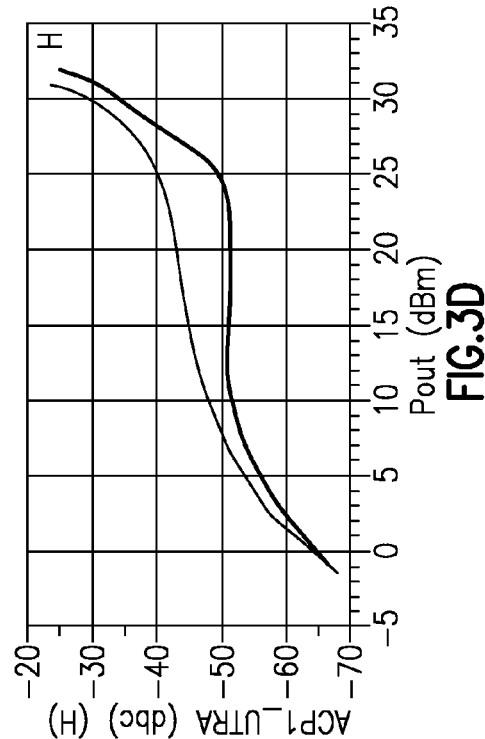
Figure 3C:
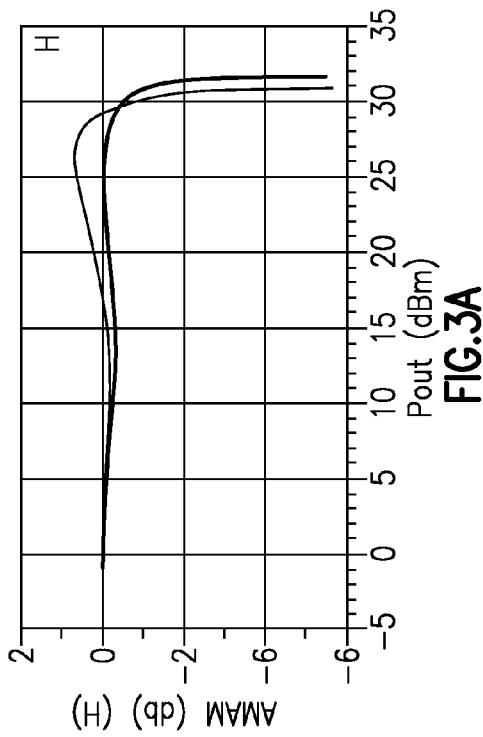
Figure 3D:
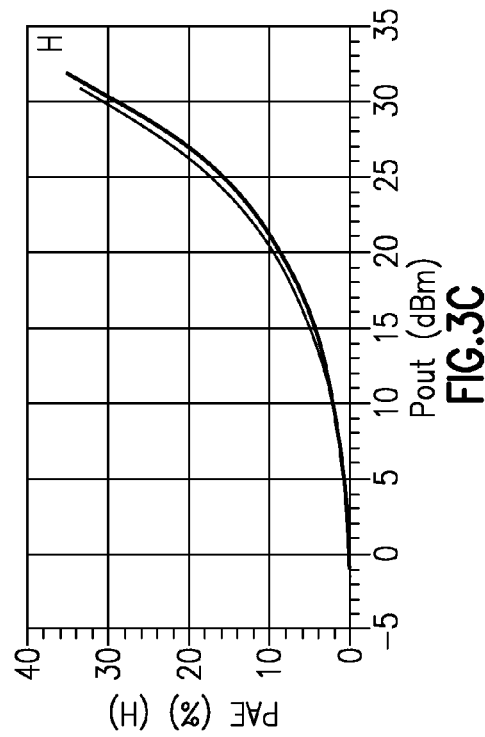

FIGS. 3A to 3D are graphs that compare various performance parameters of power amplifier performance in a power amplifier system with the mode linearization switch circuit 20 of FIG. 2A with corresponding power amplifier system with a class E matching network. In FIGS. 3A to 3D, the darker curves correspond to a power amplifier system with the mode linearization switch circuit 20 of FIG. 2A and the lighter curves correspond to a corresponding power amplifier system with a class E matching network. FIG. 3A illustrates that the mode linearization circuit 20 of FIG. 2A can improve gain linearity, which should improve the ACP. FIG. 3B illustrates a significant improvement in AMPM, which should improve the ACP. FIG. 3C shows only a slight impact on PAE by the mode linearization switch circuit, with the mode linearization switch circuit 20 of FIG. 2A resulting in approximately a 1% decrease in PAE at certain output power levels. When the mode linearization switch circuit 20 includes a FET switch, PAE variation can depend on a gate width of the FET switch. FIG. 3D illustrates that the mode linearization switch circuit 20 of FIG. 2A can improve ACP to about −49 dBc at 25 dBm. In general, simulation results indicate that there is minimal variation change resulting from process variations from designs with the mode linearization switch circuit 20 compared to corresponding previous designs without the mode linearization switch circuit. Accordingly, the mode linearization switch circuit 20 can handle process variations.

Figure 4:
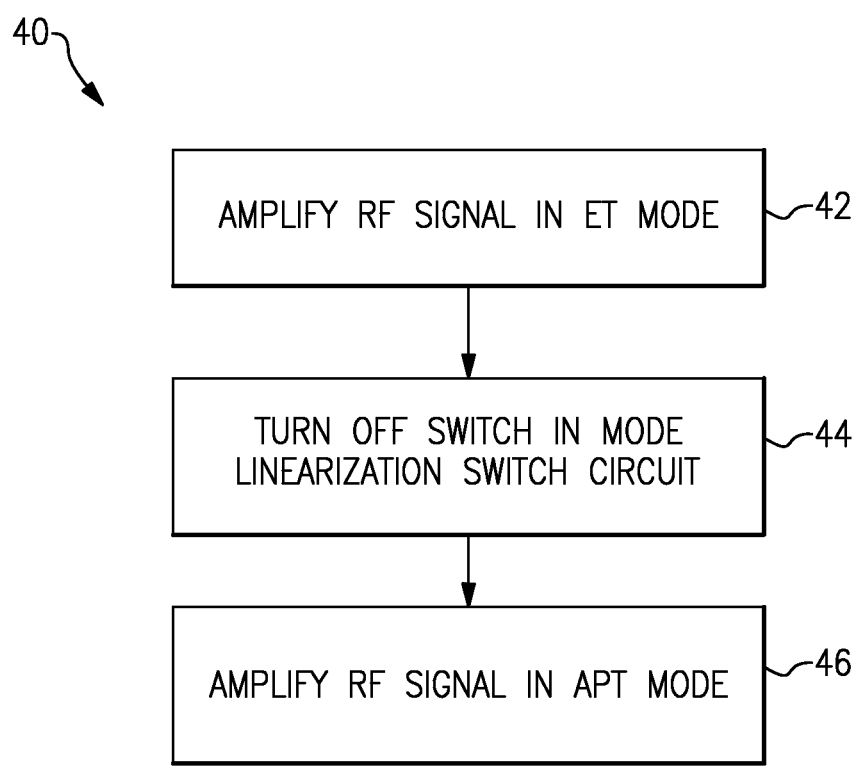
FIG. 4 is a flow diagram of an example method of operating a power amplifier system according to an embodiment.

FIG. 4 is a flow diagram of an illustrative method 40 of operating a power amplifier system according to an embodiment. The method 40 can include amplifying a radio frequency (RF) signal with a power amplifier in an envelope tracking mode at block 42. The method 40 can include turning off a switch in a mode linearization switch circuit that is electrically coupled to an output of the power amplifier at block 44. The switch can be on at block 42 while the power amplifier is amplifying the RF signal in the envelope tracking mode. The mode linearization switch circuit can include the switch, a capacitor in series with the switch and an inductor in parallel with the switch. The inductor in parallel with the switch can be included in a series LC circuit that is in parallel with the switch. For instance, the mode linearization switch circuit can be the mode linearization switch circuit 20 of FIG. 2A according to certain embodiments. The switch can be turned off by adjusting a state of a mode control signal provided to the switch. When the switch includes a field effect transistor, the mode control signal can be provided to a gate of the field effect transistor. At block 46, when the switch is turned off, the RF signal can be amplified by the power amplifier in an average power tracking mode. The method 40 can further include turning the switch on and amplifying the RF signal in the ET mode while the switch is on. In some instances, the method 40 can include providing a bias voltage at a node between the switch and the capacitor, in which the bias voltage is at a lower voltage level in envelope tracking mode than in the average power tracking mode. The method 40 can be implemented in connection with any of the electronic systems discussed herein.

Figure 5:
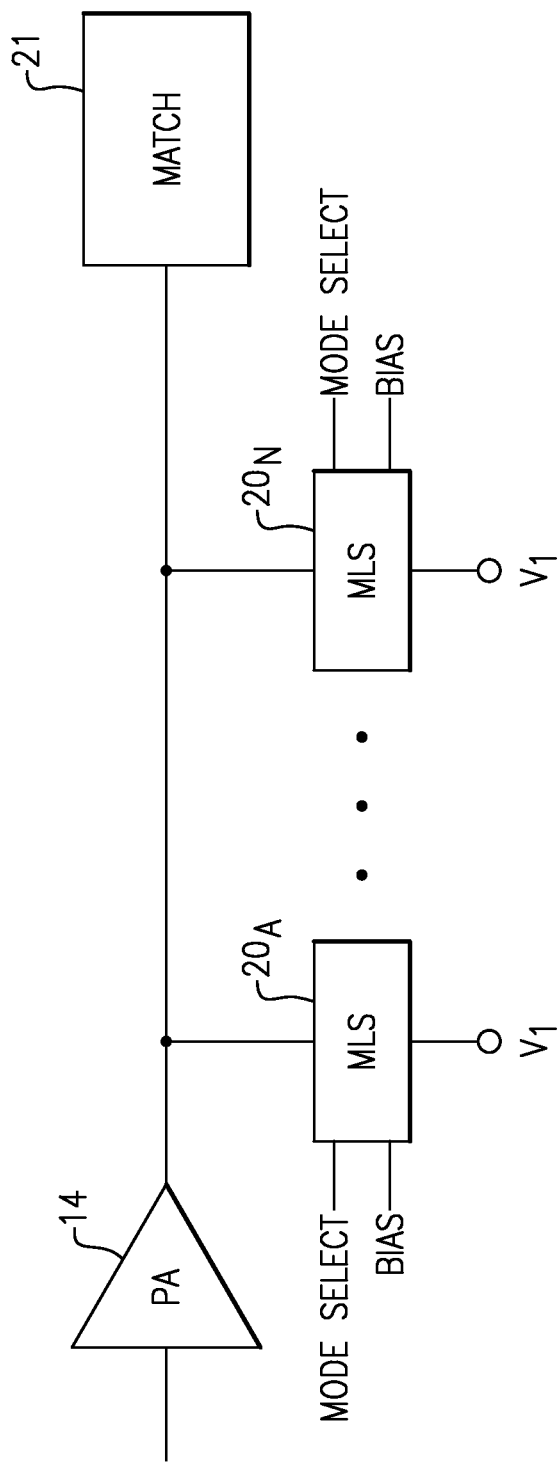
FIG. 5 is a schematic diagram of a portion of a power amplifier system that includes a plurality of mode linearization switch circuits according to an embodiment.

FIG. 5 is a schematic diagram of a portion of a power amplifier system that includes a plurality of mode linearization switch circuits 20a to 20n according to an embodiment. In FIG. 5, the power amplifier system includes a plurality of mode linearization switch circuits 20a to 20n in parallel with each other. Each of the mode linearization switch circuits 20a to 20n can include any combination of features discussed with reference to FIGS. 2A to 2D. A power amplifier module can include the circuits illustrated in FIG. 5. The power amplifier module can include a power amplifier die on which at least the power amplifier 14 and one or more mode linearization switch circuits 20a to 20n are implemented.

Each of the mode linearization switch circuits 20a to 20n can be configured for performance at a particular frequency band. For instance, the capacitances of the first capacitor C1 (FIG. 2A) and the second capacitor C2 (FIG. 2A) can be selected for a desired class E performance at a particular frequency band. Additionally, the capacitance of the third capacitor C3 (FIG. 2A) and the inductor L1 (FIG. 2A) can be selected for a desired performance in APT mode at the particular frequency band. Each of the mode linearization switch circuits 20a to 20n can be configured for a desired performance at a different frequency band. For instance, the mode linearization switch circuit 20a can be configured to enhance performance for a first frequency band and the mode linearization switch circuit 20n can be configured to enhance performance of a second frequency band, in which the second frequency band is different than the first frequency band. Alternatively or additionally, a plurality of mode linearization switch circuits can be coupled to outputs of different power amplifiers and each of such mode linearization switch circuits can be configured with an effective impedance for one or more particular frequency bands.

Two or more of the mode linearization switch circuits 20a to 20n can provide harmonic termination for different harmonic frequencies of an RF signal amplified by the power amplifier 14. Alternatively or additionally, two or more of the mode linearization switch circuits 20a to 20n can be configured to provide harmonic termination associated with RF signals provided by the power amplifier 14 that are in different frequency bands.

Figure 6:
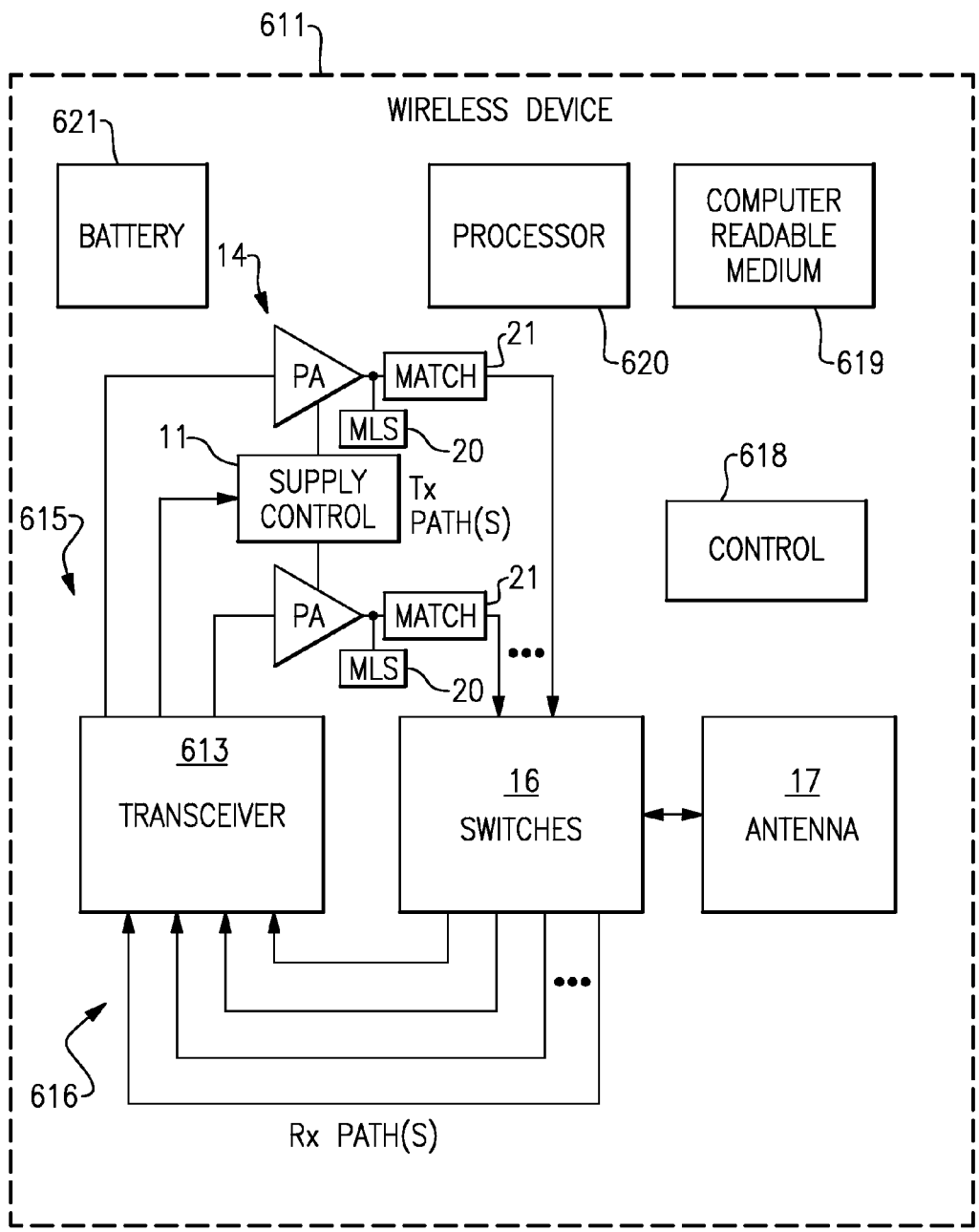
FIG. 6 is a schematic block diagram of an example wireless device that can include one or more of the power amplifier systems of FIG. 1 and/or FIG. 5.

The power amplifier systems discussed herein can be implemented in wireless devices, such as wireless device 611 of FIG. 6. Such a wireless device can be a mobile phone, such as a smart phone. The example wireless device 611 depicted in FIG. 6 can represent a multi-band and/or multi-mode device such as a multi-band/multi-mode mobile phone. In certain embodiments, the wireless device 611 can include a switch module 16, a transceiver 613, an antenna 17, power amplifiers 14 with mode linearization switch circuits 20 and matching networks 21, a supply control 11, a control component 618, a computer readable medium 619, a processor 620, and a battery 621.

The transceiver 613 can generate RF signals for transmission via the antenna 17. Furthermore, the transceiver 613 can receive incoming RF signals from the antenna 17.

It will be understood that various functionalities associated with the transmission and receiving of RF signals can be achieved by one or more components that are collectively represented in FIG. 6 as the transceiver 613. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 6 as the antenna 17. For example, a single antenna can be configured to provide both transmitting and receiving functionalities. In another example, transmitting and receiving functionalities can be provided by separate antennas. In yet another example, different bands associated with the wireless device 611 can be provided with different antennas and/or different antenna ports.

In FIG. 6, one or more output signals from the transceiver 613 are depicted as being provided to the antenna 17 via one or more transmission paths 615. In the example shown, different transmission paths 615 can represent output paths associated with different bands and/or different power outputs. For instance, the two example power amplifiers 14 shown can represent amplifications associated with different power output configurations (e.g., low power output and high power output), and/or amplifications associated with different bands. Each power amplifier 14 can be coupled to a different mode linearization switch circuit 20, which can implement any combination of features of the mode linearization switch circuits discussed herein. Although FIG. 6 illustrates a configuration using two transmission paths 615, the wireless device 611 can include more or fewer transmission paths 615.

The power amplifiers 14 can be used to amplify a wide variety of RF signals. For example, one or more of the power amplifiers 14 can receive an enable signal that can be used to pulse the output of the power amplifier to aid in transmitting a wireless local area network (WLAN) signal or any other suitable pulsed signal. In certain embodiments, one or more of the power amplifiers 14 are configured to amplify a Wi-Fi signal. Each of the power amplifiers 14 need not amplify the same type of signal. For example, one power amplifier can amplify a WLAN signal, while another power amplifier can amplify, for example, a Global System for Mobile (GSM) signal, a code division multiple access (CDMA) signal, a W-CDMA signal, a Long Term Evolution (LTE) signal, or an EDGE signal. One or more features of the present disclosure can be implemented in the foregoing example modes and/or bands, and in other communication standards.

In FIG. 6, one or more detected signals from the antenna 17 are depicted as being provided to the transceiver 613 via one or more receiving paths 616. In the example shown, different receiving paths 616 can represent paths associated with different bands. Although FIG. 6 illustrates a configuration using four receiving paths 616, the wireless device 611 can be adapted to include more or fewer receiving paths 616.

To facilitate switching between receive and transmit paths, the switch module 16 can be configured to electrically connect the antenna 17 to a selected transmit or receive path. Thus, the switch module 16 can provide a number of switching functionalities associated with an operation of the wireless device 611. In certain embodiments, the switch module 16 can include a number of switches configured to provide functionalities associated with, for example, switching between different bands, switching between different power modes, switching between transmission and receiving modes, or some combination thereof. The switch module 16 can also be configured to provide additional functionality, including filtering and/or duplexing of signals.

FIG. 6 shows that in certain embodiments, a control component 618 can be provided for controlling various control functionalities associated with operations of the switch module 16, the power amplifiers 14, and/or other operating component(s). The control component 618 can be implemented on the same die as the power amplifier 14 in certain implementations. The control component 618 can be implemented on a different die than the power amplifier in some implementations. The control component 618 can bias circuit(s) and/or other control functionality.

In certain embodiments, a processor 620 can be configured to facilitate implementation of various processes described herein. For the purpose of description, embodiments of the present disclosure may also be described with reference to flowchart illustrations and/or block diagrams of methods, apparatus (systems) and computer program products. It will be understood that one or more blocks of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable implementation of the acts specified in the flowchart and/or block diagram block or blocks.

In certain embodiments, these computer program instructions may also be stored in a non-transitory computer-readable memory 619 that can direct a computer or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the acts specified in the flowchart and/or block diagram block or blocks.

The battery 621 can be any suitable battery for use in the wireless device 611, including, for example, a lithium-ion battery.

Some of the embodiments described above have provided examples in connection with power amplifiers and/or mobile devices. However, the principles and advantages of the embodiments can be used for any other systems or apparatus that could benefit from any of the mode linearization switch circuits described herein. While certain embodiments are discussed with reference to power amplifiers, the principles and advantages discussed herein can be applied to mode linearization switch circuits coupled to the outputs of other types of amplifiers, such as other amplifiers configured to amplify RF signals.

Aspects of this disclosure can be implemented in various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a telephone, a television, a computer monitor, a computer, a modem, a hand-held computer, a laptop computer, a tablet computer, an electronic book reader, a wearable computer such as a smart watch, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a washer, a dryer, a washer/dryer, a peripheral device, a wrist watch, a clock, etc. Further, the electronic devices can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments of the inventions have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while processes or blocks are presented in a given order, alternative embodiments may perform routines having operations, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A radio frequency circuit comprising:
an amplifier configured to amplify a radio frequency signal; and
a mode linearization switch circuit including a capacitor, a switch in series with the capacitor, and a series LC circuit in parallel with the switch, and the mode linearization switch circuit being configured to provide an effective impedance between an output of the amplifier and a power low supply voltage, the effective impedance including an impedance of the capacitor in series with an impedance of the series LC circuit when the switch is off.

2. The radio frequency circuit of claim 1 wherein the switch is configured to be biased on in an enveloping tracking mode and to be biased off in an average power tracking mode.

3. The radio frequency circuit of claim 2 wherein the effective impedance of the mode linearization switch circuit is configured to cause linearity of the amplifier to be improved when the switch is biased off.

4. The radio frequency circuit of claim 2 wherein the effective impedance of the mode linearization switch circuit is configured for class E operation when the switch is biased on.

5. A radio frequency circuit comprising:
an amplifier configured to amplify a radio frequency signal; and
a mode linearization switch circuit electrically coupled to an output of the amplifier, the mode linearization switch circuit including a capacitor, a switch in series with the capacitor, a series LC circuit in parallel with the switch, and a second capacitor in series with the switch.

6. The radio frequency circuit of claim 5 wherein the switch is electrically coupled between the capacitor and the second capacitor.

7. The radio frequency circuit of claim 1 wherein the amplifier includes a power amplifier.

8. The radio frequency circuit of claim 7 wherein the power amplifier and the mode linearization switch circuit are included on the same die.

9. The radio frequency circuit of claim 7 wherein the radio frequency circuit is included in a power amplifier module, the power amplifier including a power amplifier die and an other die, and the power amplifier die including the power amplifier.

10. A mobile device comprising the radio frequency circuit of claim 7 and an antenna in communication with the power amplifier.

11. The radio frequency circuit of claim 1 wherein the switch includes a field effect transistor.

12. The radio frequency circuit of claim 1 further comprising an additional mode linearization switch circuit in parallel with the mode linearization switch circuit, the additional mode linearization switch circuit and the mode linearization switch circuit having respective effective impedances configured to match different frequency bands.

13. The radio frequency circuit of claim 1 wherein the mode linearization switch circuit is configured to receive a bias voltage at a node between the capacitor and the series LC circuit, the bias voltage being at a lower voltage level when the switch is biased on than when the switch is biased off.

14. An electronically implemented method of amplifying a radio frequency signal, the method comprising:
amplifying a radio frequency signal with a power amplifier transistor in an envelope tracking mode;
turning off a switch in a mode linearization switch circuit that is electrically coupled to an output of the power amplifier transistor, the mode linearization switch circuit including the switch, a capacitor in series with the switch, and an inductor coupled in parallel with the switch; and
while the switch is off, amplifying the radio frequency signal with the power amplifier transistor in an average power tracking mode.

15. The method of claim 14 wherein the switch includes a field effect transistor and turning off the switch includes adjusting a state of a mode control signal provided to a gate of the field effect transistor.

16. The method of claim 14 further comprising providing a bias voltage at a node between the switch and the capacitor, the bias voltage being at a lower voltage level in envelope tracking mode than in the average power tracking mode.

17. A power amplifier system comprising:
a power amplifier including a power amplifier transistor configured to amplify a radio frequency signal in an average power tracking mode and in an envelope tracking mode; and
a mode linearization switch circuit including a capacitor, an impedance circuit, and a switch configurable into at least a first state in the average power tracking mode and a second state in the envelope tracking mode, the mode linearization switch circuit configured to provide an impedance of the capacitor in series with an impedance of the impedance circuit to an output of the power amplifier when the switch is in the first state and to prevent the impedance of the impedance circuit from significantly impacting the output of the power amplifier when the switch is in the second state.

18. The power amplifier system of claim 17 wherein the switch is in parallel with the impedance circuit.

19. The power amplifier system of claim 17 wherein the impedance circuit includes a series LC circuit.

20. The power amplifier system of claim 19 wherein the capacitor and the impedance circuit are coupled between the output of the power amplifier and ground.

* * * * *